(12) United States Patent
A

(10) Patent No.: US 6,906,657 B1  
(45) Date of Patent: Jun. 14, 2005

(54) SUCCESSIVE APPROXIMATION ANALOG-TO-DIGITAL CONVERTER WITH SAMPLE AND HOLD ELEMENT

(75) Inventor: Chandra Shekar A, Medak AP (IN)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/750,198

(22) Filed: Dec. 31, 2003

(51) Int. Cl.[7] .............................................. H03M 1/40
(52) U.S. Cl. ...................................... 341/163; 341/122
(58) Field of Search ............................... 341/122, 161, 341/162, 163, 164, 165

(56) References Cited

U.S. PATENT DOCUMENTS

| | | | | |
|---|---|---|---|---|
| 4,323,887 A | * | 4/1982 | Buurma | 341/165 |
| 4,749,984 A | * | 6/1988 | Prost et al. | 341/156 |
| 4,769,628 A | * | 9/1988 | Hellerman | 341/162 |

FOREIGN PATENT DOCUMENTS

| | | | | |
|---|---|---|---|---|
| JP | 54000963 A | * | 1/1979 | H03K/13/175 |
| JP | 06120829 A | * | 4/1994 | H03M/1/38 |

* cited by examiner

*Primary Examiner*—Howard L. Williams  
(74) *Attorney, Agent, or Firm*—Buckley, Maschoff & Talwalkar LLC

(57) ABSTRACT

According to some embodiments, a successive approximation analog-to-digital converter is provided.

18 Claims, 8 Drawing Sheets

US 6,906,657 B1

SUCCESSIVE APPROXIMATION ANALOG-TO-DIGITAL CONVERTER WITH SAMPLE AND HOLD ELEMENT

BACKGROUND

In some cases, an analog signal is converted into a digital signal. For example, a processor or other device might convert an analog input signal into a series of bits that represent the value of the input signal at a particular time. Improving the speed at which an analog signal can be converted and/or increasing the resolution of the conversion (e.g., the number of bits that represent the analog signal) may improve the performance of the device.

DETAILED DESCRIPTION

An Analog-to-Digital Converter (ADC) circuit receives an analog input signal and generates a digital output signal that represents the input signal. A number of different approaches may be used to create an ADC circuit, including flash conversion (e.g., using a large bank of converters), pipelined conversion (e.g. using a parallel structure), sigmadelta conversion (e.g., using over sampling), or a conversion using a Successive Approximation Register (SAR) algorithm.

Figure 1:
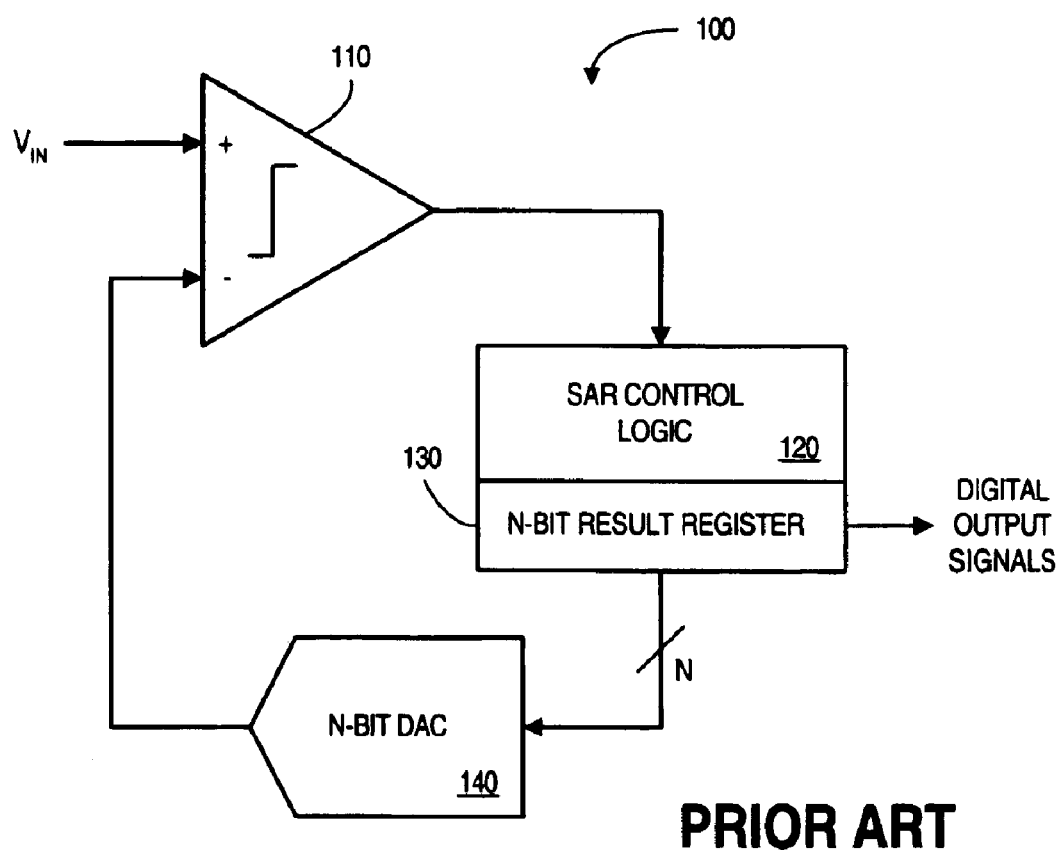
FIG. 1 is a block diagram of a successive approximation register type analog-to-digital converter circuit.

FIG. 1 is a block diagram of a SAR conversion ADC circuit 100. The circuit 100 includes a comparator 110 that receives an analog input signal $V_{IN}$ (e.g., after the analog signal passes through a track and hold element). The output of the comparator 110 is provided to SAR control logic 120 which may update bits in an N-bit result register 130. The bits in the result register 130 are converted back into an analog signal by an N-bit Digital-to-Analog Converter (DAC) 140, and the output of the DAC 140 is used as the other input for the comparator 110 (e.g., such that the output of the comparator 110 is "1" when $V_{IN}$ is greater than the output of the DAC 140).

The DAC 140 may, for example, convert the digital information into an analog signal having a value between ground (when the result register 130 has all 0s) and a reference voltage $V_{REF}$ (when the result register 130 has all 1s). Moreover, the result register 130 may be initially set to a mid-range value (e.g., a five-bit result register might be initialized to "10000"). In this case, the output of the DAC 140 will equal $V_{REF}/2$. The comparator 110 may then determine whether $V_{IN}$ is less than $V_{REF}/2$. If not (e.g., the output of the comparator 110 is "1"), the control logic 120 may set the Most Significant Bit (MSB) of the result register 130 to 1. On the other hand, if $V_{IN}$ is less than $V_{REF}/2$ the control logic 120 may set the MSB of the result register 130 to "0." The process is repeated for each bit until the Least Significant Bit (LSB) of the result register 130 is set. At that point, the result register 130 will contain a digital representation of the analog input signal $V_{IN}$. Note that the speed and accuracy of the ADC circuit 100 may depend at least in part on the speed and accuracy of the DAC 140.

Figure 2:
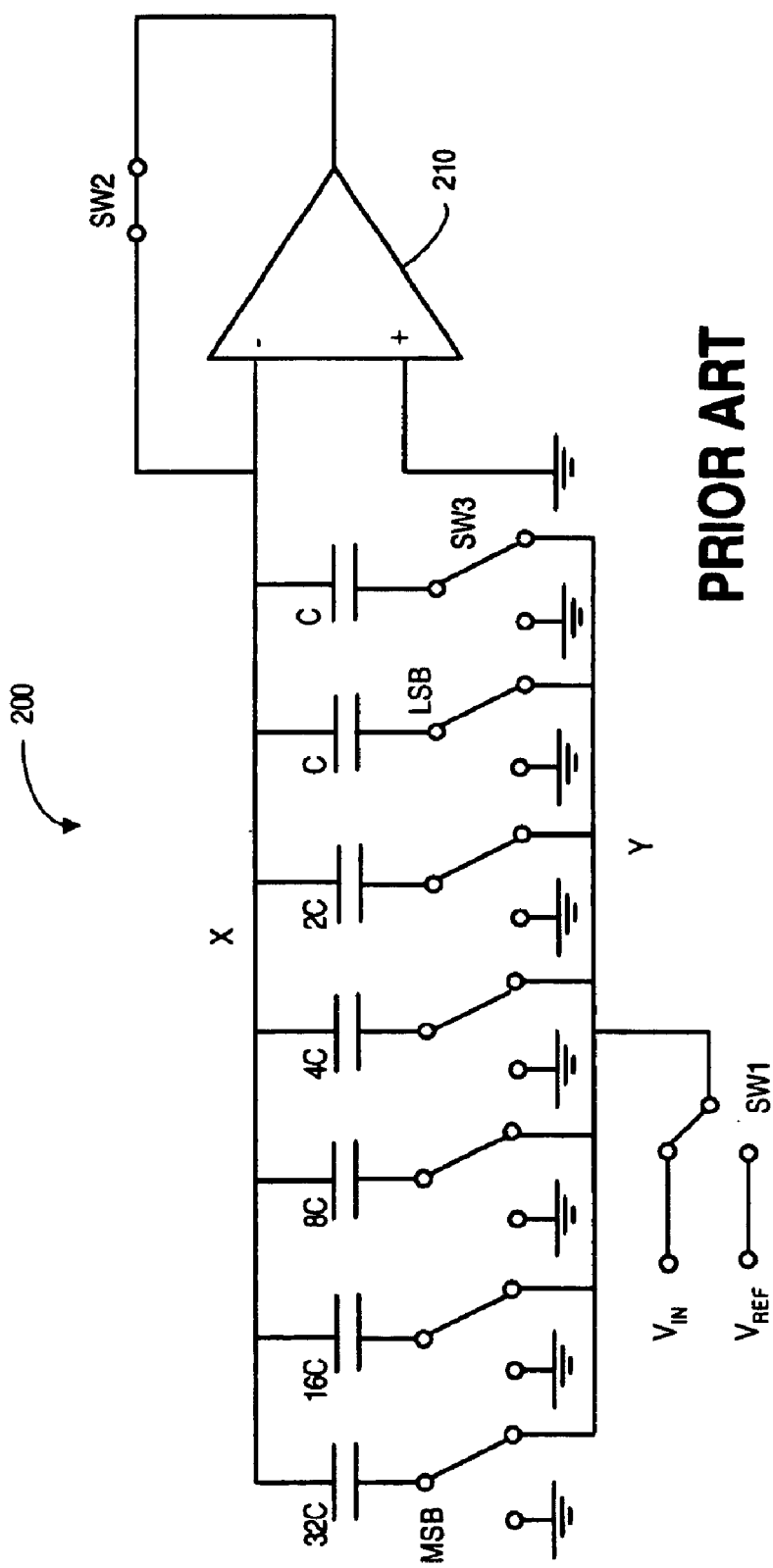
FIG. 2 is an example of a six-bit capacitive charge based analog-to-digital converter circuit.

FIG. 2 is one example of a six-bit capacitive charge based ADC circuit 200. The circuit 200 includes an array of seven capacitors connected to a comparator 210. The first two capacitors in the array have a "C" unit capacitance value. The capacitance is then doubled for each successive capacitor in the array (e.g. 2C, 4C, . . . 32C).

The ADC circuit 200 may convert an analog input signal $V_{IN}$ to a digital output signal by performing the following three operations: (i) sampling, (ii) holding, and (iii) bit cycling. In the "sampling" mode, all switches in the circuit 200 are placed in the positions illustrated in FIG. 2. As a result, all of the capacitors are charged to $V_{IN}$.

In the "hold" mode, the comparator 210 is kept in open loop by opening SW2 and all of the capacitors are switched to ground. As a result, the voltage at node X becomes negative $V_{IN}$.

SW1 is then connected to $V_{REF}$ and the MSB capacitor switch is connected to node Y to enter the "bit cycling" mode. This causes the voltage at node X to become $(-V_{IN} + V_{REF}/2)$. If $V_{IN}$ is not less than $V_{REF}/2$, (i) the voltage at node X will be negative, (ii) the MSB capacitor switch is left connected to $V_{REF}$ (through SW1), and (iii) the output of the comparator 210 will be 1. Otherwise, if $V_{IN}$ is less than $V_{REF}/2$ (i) the MSB capacitor switch is connected back to ground and (ii) the output of the comparator 210 will be 0. These operations are repeated six times until the LSB capacitor switch is reached.

Note that an N-bit analog-to-digital conversion may require N+1 capacitors that exponential increases in capacitance. Thus, increasing the resolution of the ADC circuit 200 may require capacitors with impractically large capacitance values. In addition, all of the capacitors may need to have accurate matching characteristics (e.g., if a capacitor that is supposed to have a capacitance of 16C deviates from that value, the accuracy of the ADC circuit 200 may be degraded). Moreover, the conversion speed of the ADC circuit 200 may be limited by the settling time of the MSB capacitor.

Figure 3:
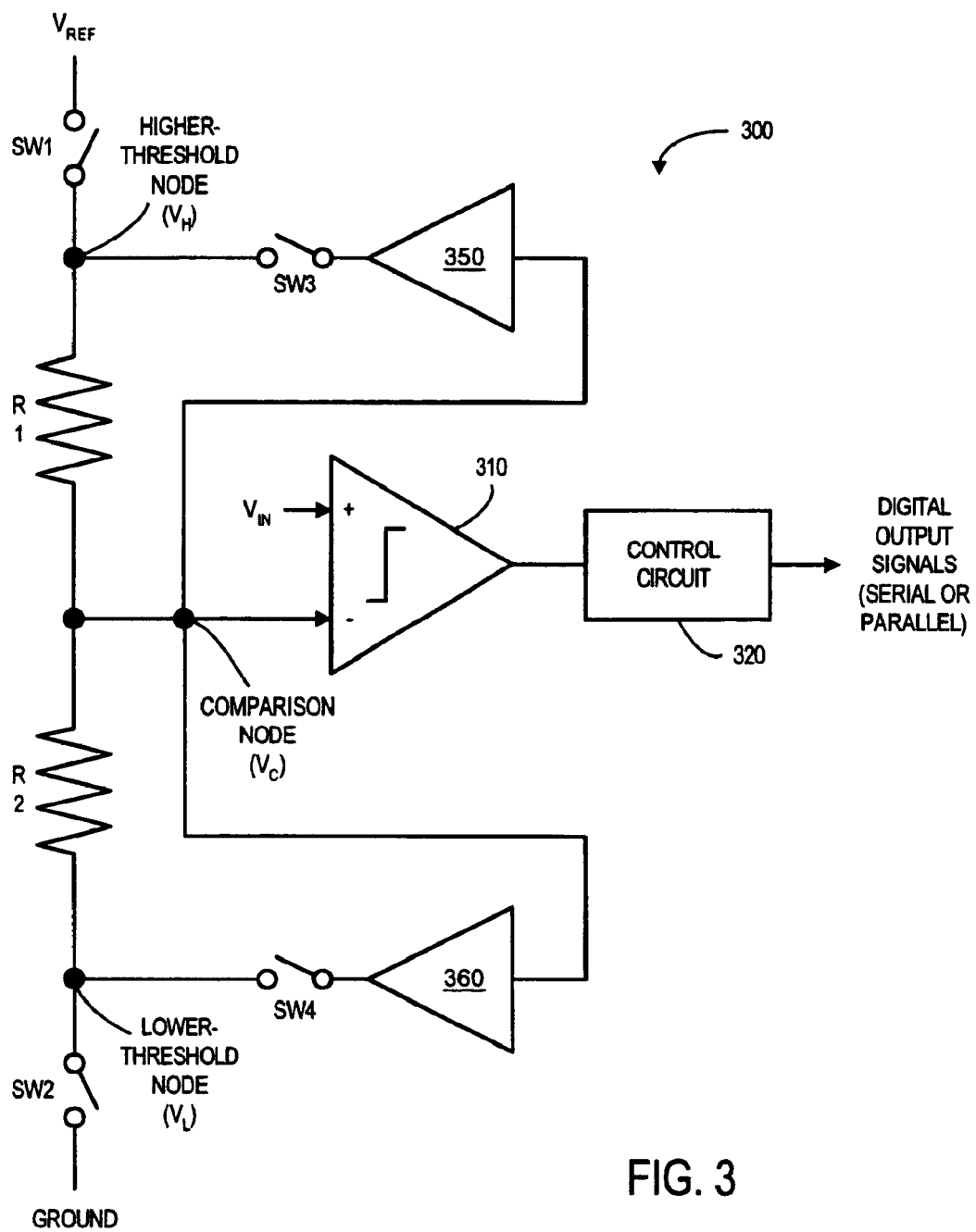
FIG. 3 is a block diagram of an apparatus according to some embodiments.

FIG. 3 is a block diagram of an apparatus 300 according to some embodiments. A comparator 310 receives an analog input signal $V_{IN}$ along with a "comparison" signal $V_C$ from a comparison node and generates a digital result which is provided to a control circuit 320.

$V_C$ is associated with a voltage divider having two resistors (R1 and R2) with substantially the same resistance. In particular, one end of R1 (referred to herein as the "higher-threshold" node) is coupled to a reference voltage $V_{REF}$ through a first switch SW1 and the other end of R1 is coupled to R2 at the comparison node. The other end of R2 (referred to herein as the "lower-threshold" node) is coupled to ground through a second switch SW2. As a result, when the voltage at the higher-threshold node is $V_H$ and the voltage at the lower-threshold node is $V_L$, $V_C$ will equal $(V_H + V_L)/2$ (because R1 and R2 have substantially the same resistance).

Figure 4:
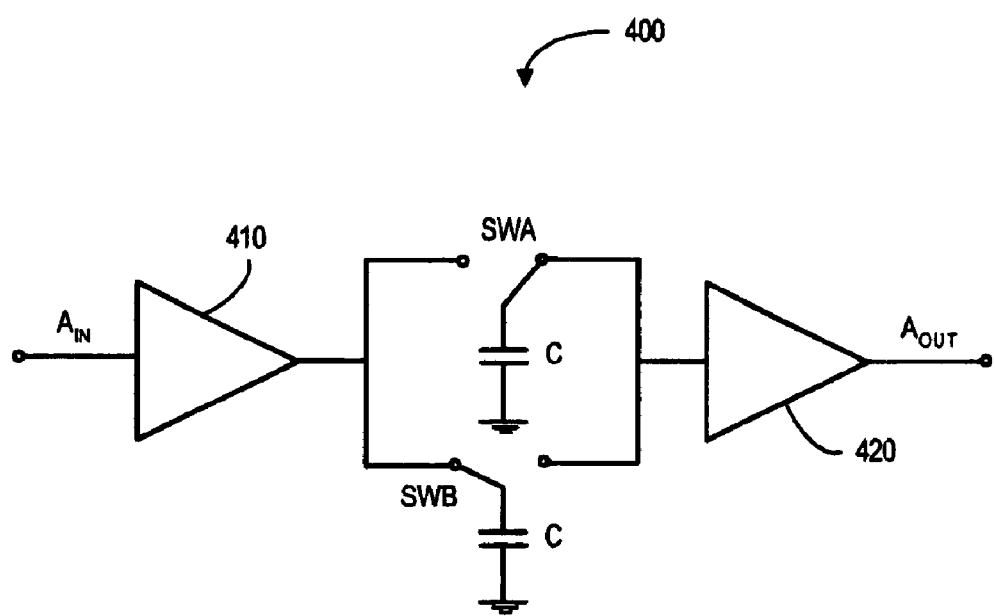
FIG. 4 is an example of one type of sample and hold element.

In addition, the comparison node is coupled to the higher-threshold node through a sample and hold element 350 and a third switch SW3. Similarly, the comparison node is coupled to the lower-threshold node through another sample and hold element 360 and a fourth switch SW4. The sample and hold elements 350, 360 may comprise amplifiers that each have an output that is isolated from an input. For example, FIG. 4 is an example of one type of sample and hold element 400 that could be used as a sample and hold element. In particular, two buffers 410, 420 isolate an output signal ($A_{OUT}$) from an input signal ($A_{IN}$). Note that a control line (e.g., from the control circuit 320) may control the operation of the amplifier 400 via switches (SWA and SWB) to transfer a signal through the element.

Figure 5:
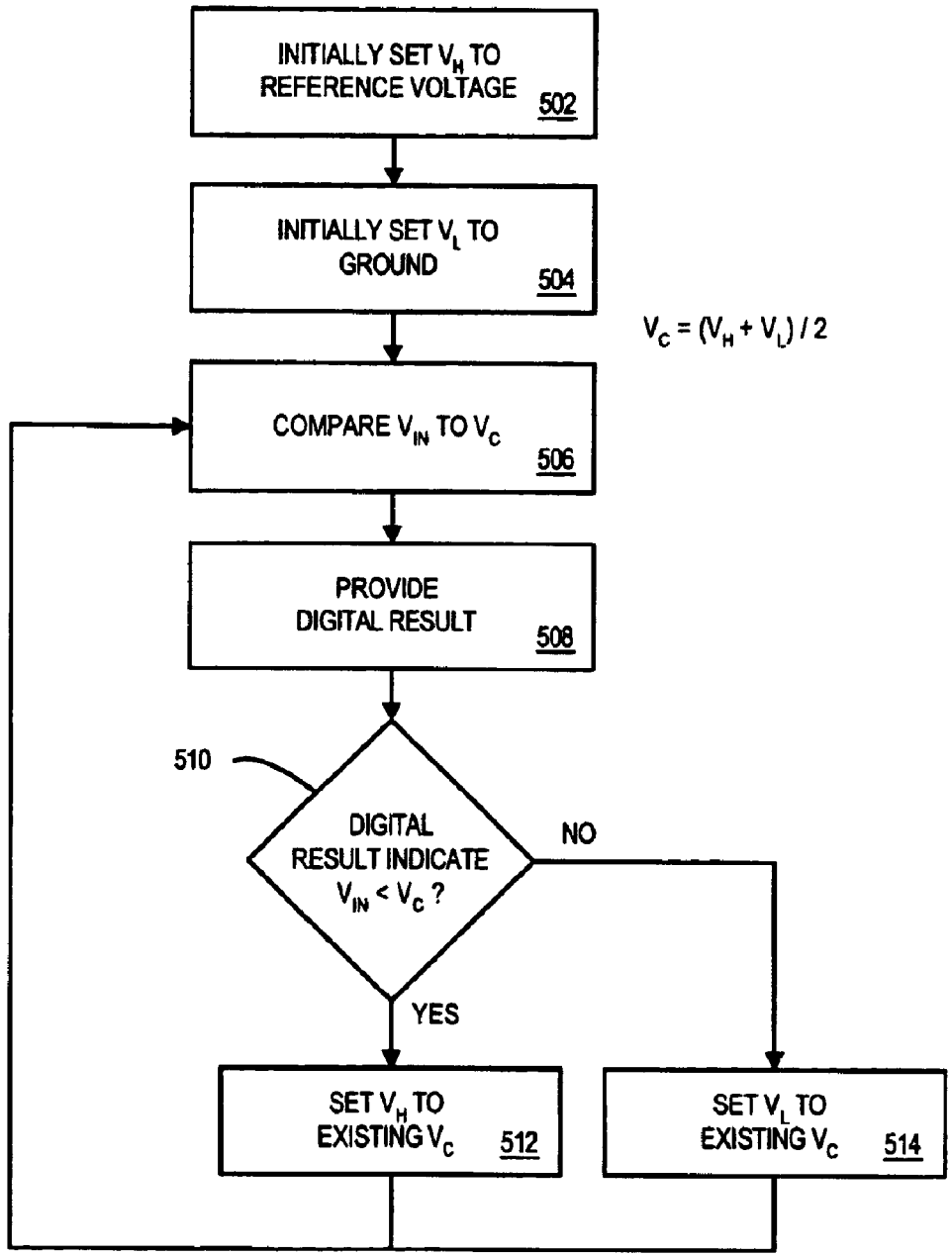
FIG. 5 is a flow chart of a method according to some embodiments.

The operation of the apparatus 300 according to some embodiments will now be described with respect to a flow chart illustrated in FIG. 5. At 502, $V_H$ is initially set $V_{REF}$. Similarly, $V_L$ is initially set to ground at 504. That is, SW1 and SW2 may be closed and SW3 and SW4 may be opened (to remove the sample and hold elements from the apparatus 300). $V_C$ will therefore initially equal $V_{REF}/2$ because $V_C$ equals $(V_H+V_L)/2$, $V_H$ equals $V_{REF}$, and $V_L$ equals ground (zero volts).

The comparator 310 compares the analog input signal $V_{IN}$ with $V_C$ (that is, with $V_{REF}/2$ during the first conversion cycle) at 506. The digital result of the comparison (0 or 1) is then provided at 508. For example, the result may be stored into a multi-bit result register (e.g., and parallel digital output signals may be provided after the conversion is complete). According to another embodiment, a serial digital output signal is provided.

If the result indicates that $V_{IN}$ is less than $V_C$ at 510, $V_H$ is adjusted lower at 512. In particular, $V_H$ is set to the existing value of $V_C$ by opening SW1 (to remove $V_{REF}$), closing SW3, and transferring the existing $V_C$ to the higher-threshold node via sample and hold element 350. In effect, the "ceiling" of future comparisons is being lowered.

If the result indicates that $V_{IN}$ is not less than $V_C$ at 510, $V_L$ is adjusted higher at 514. In particular, $V_L$ is set to the existing value of $V_C$ by opening SW2 (to remove ground), closing SW4, and transferring the existing $V_C$ to the lower-threshold node via sample and hold element 360. In effect, the "floor" of future comparisons is being raised.

After $V_C$ is adjusted, the conversion cycle is successively repeated at 506 until a digital representation of $V_{IN}$ has been generated. By way of example only, consider a three-bit ADC circuit in which $V_{REF}$ equals 1.0 and $V_{IN}$ equals 0.3. In this case, $V_C$ will equal 0.5 during the conversion cycle associated with the MSB. Since $V_{IN}$ is less than $V_C$, a zero is output as a result and $V_H$ is adjusted down to the existing $V_C$ (0.5).

The next conversion cycle is then performed. In this case, however, $V_C$ will be $(0.5+0)/2$ or 0.25. Since $V_{IN}$ is not less than $V_C$, a 1 is output as a result and $V_L$ is adjusted up to the existing $V_C$ (0.25). Thus, for the third conversion cycle $V_C$ will equal $(0.5+0.25)/2$ or 0.375. After the third conversion cycle is complete, the result register will store "010" (the three-bit digital representation of the analog input signal $V_{IN}$).

Note that once SW1 or SW2 is opened, it may remain in the open position until the conversion is complete (the switches may then be returned to the closed position to re-initialize $V_H$ and $V_L$ for the next conversion). Similarly, once SW3 or SW4 is closed, it may remain in the closed position until the conversion is complete (e.g., $V_C$ may be transferred to the higher-threshold node or the lower-threshold node using control lines from the control circuit 320 to the sample and hold elements 350, 360).

Figure 6:
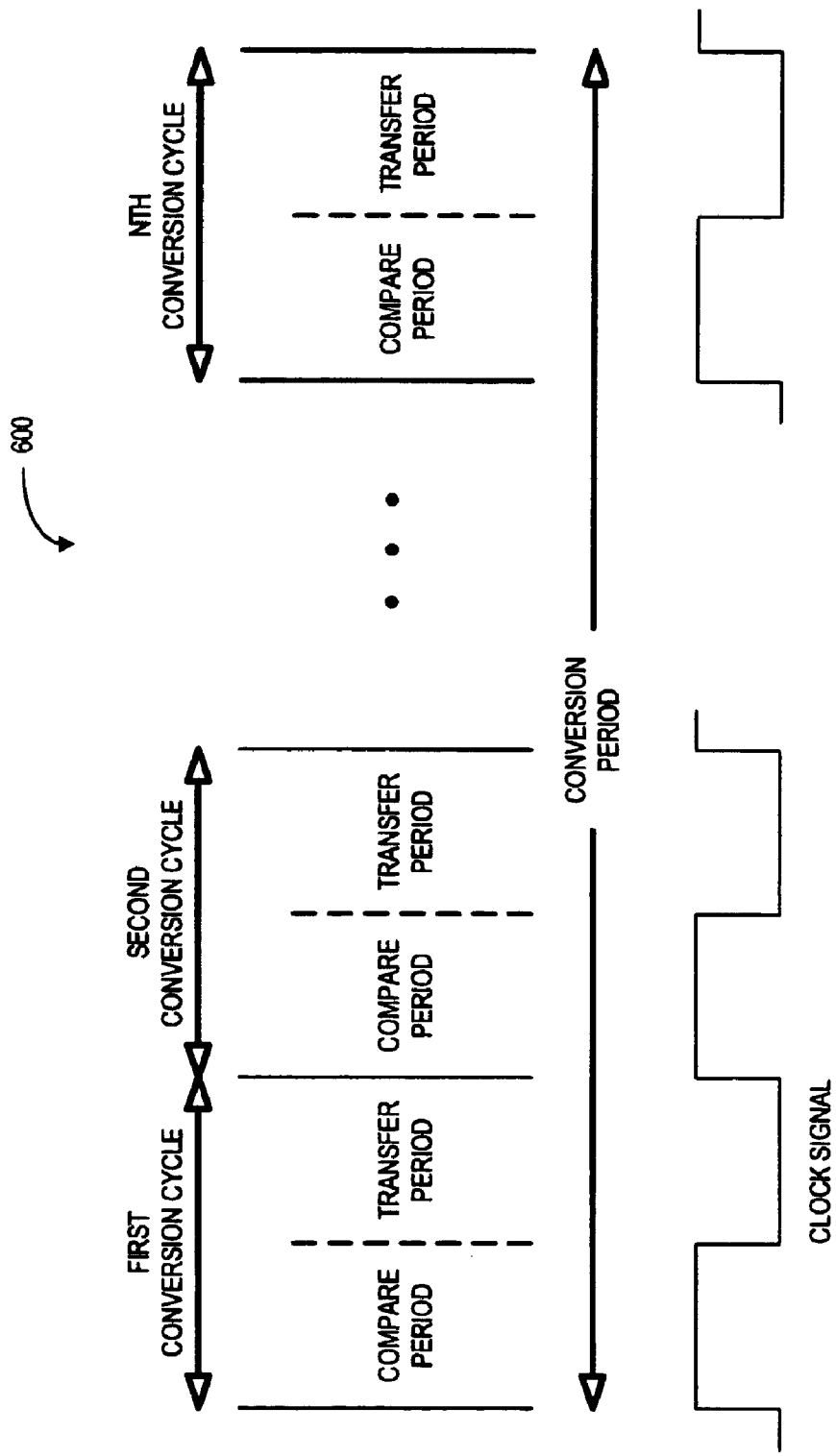
FIG. 6 is a timeline illustrating compare and transfer periods according to some embodiments.

Thus, each conversion cycle includes a "compare period" during which actions 506 and 508 are performed and a "transfer period" during which actions 510 and 512 (or 514) are performed. FIG. 6 is a time line 600 illustrating compare and transfer periods according to some embodiments. Note that N conversion cycles may be performed to generate an N-bit digital representation of $V_{IN}$. Also note that each conversion cycle may be performed during a single clock cycle (e.g., the compare period taking place during a high clock signal portion and the transfer period occurring during a low clock signal portion).

Referring again to FIG. 3, note that the resolution of the apparatus 300 may depend on the accuracy of the comparator 310, the characteristics of the sample and hold elements 350, 360 (e.g., gain error, droop rate, and dynamic sampling error), and/or the matching of R1 and R2. However, the apparatus 300 may not require an increase in the number of matched components as the resolution of the conversion is increased. That is, only the two resistors R1 and R2 may need to having matching characteristics regardless of how many bits are generated. Since matching may be needed for only a limited number of components, external matching resistors might be used (e.g., composed of Tantalum Nitride or Nickel Chromium).

In addition, the speed of the apparatus 300 might only be limited by the speed of the comparator 310 and sample and hold elements 350, 360 (e.g., and not a DAC). Similarly, because the number of analog components and logic overhead may be reduced as compared to a tradition ADC circuit, the apparatus 300 might be appropriate for relatively low-power environments (e.g., a battery operated device).

Figure 7:
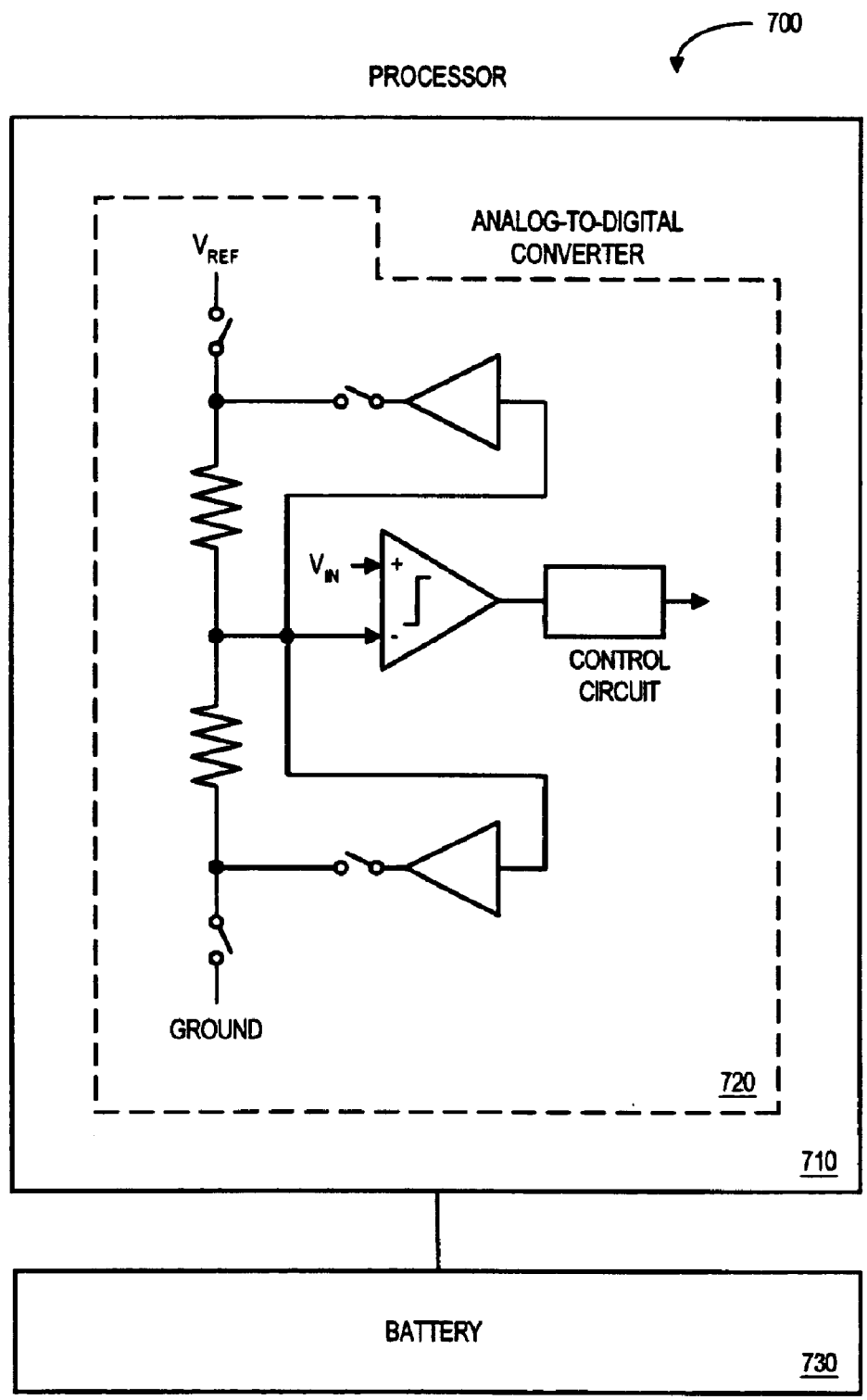
FIG. 7 is an example of a system according to some embodiments.

For example, FIG. 7 is an example of a system 700 according to some embodiments. The system includes a processor 710 with an analog to digital conversion portion 720 that operates in the accordance with any of the embodiments described herein. For example, the portion 720 might include a comparator that receives an analog input signal $V_{IN}$ along with a comparison signal $V_C$ and generates a digital result. The portion 720 might further include an adjustment circuit to adjust the comparison signal based on successive digital results from the comparator. Moreover, a battery input might be provided so that the processor 710 can receive power from a battery 730.

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although resistors are illustrated in FIG. 3, embodiments may be designed using capacitors instead. Similarly, although embodiments have been described with respect to single-ended circuit operation, embodiments may instead use differential circuit operation.

Figure 8:
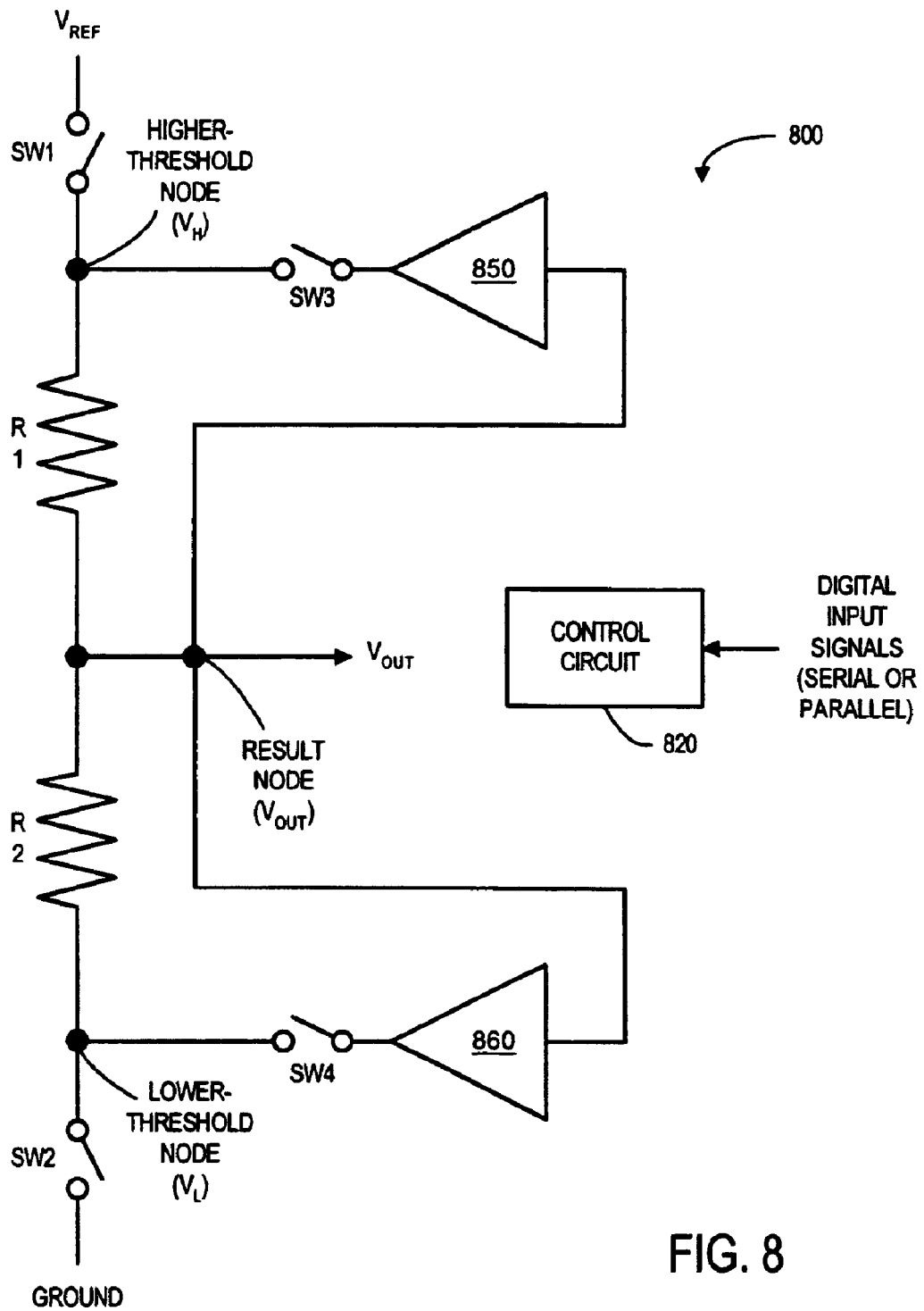
FIG. 8 illustrates an apparatus to perform digital-to-analog conversions according to some embodiments.

In addition, according to some embodiments, an apparatus may also convert digital input signals into an analog output signal. For example, circuitry might be time shared between analog-to-digital and digital-to-analog conversions. FIG. 8 illustrates an apparatus 800 to perform digital-to-analog conversions according to some embodiments. In this case, the control circuit 820 receives digital input signals $D_{IN}$ and controls switches SW1 through SW4 along with sample and hold elements 850, 860. At the end of the conversion period, $V_{OUT}$ will be an analog representation of $D_{IN}$.

For example, consider a $D_{IN}$ of "1010." At the beginning of the conversion period, SW1 and SW2 are closed and the voltage at a result node will be $0.5*V_{REF}$. During the first half of the first conversion cycle, $V_C$ is sampled by the lower-threshold sample and hold element 860 (because the MSB of $D_{IN}$ is 1).

During the second half of the first conversion cycle, SW2 is opened, SW4 is closed, and the sample and hold element 860 transfers the existing $V_{OUT}$ to $V_L$. As a result, the new $V_{OUT}$ is equal to $(V_{REF}+0.5*V_{REF})/2$ or $0.75*V_{REF}$.

Similarly, during the first half of the second conversion cycle the voltage at the result node is sampled by the higher-threshold sample and hold element 850 (because the second bit of $D_{IN}$ is 0). During the second half of this cycle SW1 is opened, SW3 is closed, and the sample and hold element 850 transfers the existing $V_{OUT}$ to $V_H$. As a result, the new $V_{OUT}$ is equal to $(0.75*V_{REF}+0.5*V_{REF})/2$ or $0.625*V_{REF}$. During the third conversion cycle, $V_{OUT}$ becomes 0.6875, and during the fourth conversion cycle $V_{OUT}$ becomes 0.71875 (which is the analog representation of "1010").

The several embodiments described herein are solely for the purpose of illustration. Persons skilled in the art will recognize from this description other embodiments may be practiced with modifications and alterations limited only by the claims.

What is claimed is:

1. An apparatus, comprising:
    a comparator to receive an analog input signal $V_{IN}$ along with a comparison signal $V_C$ and to generate a digital result, the comparison signal $V_C$ being received at a comparison node;
    a higher-threshold sample and hold element to received $V_C$ and to selectively provide $V_H$ to a higher-threshold node;
    a higher-threshold resistor having a resistance R coupled between the higher-threshold node and the comparison node;
    a lower-threshold sample and hold element to received $V_C$ and to selectively provide $V_L$ to a lower-threshold node; and
    a lower-threshold resistor coupled between the lower-threshold node and the comparison node.

2. The apparatus of claim 1, wherein
    the comparison signal is adjusted based on successive digital results from the comparator and $V_C$ substantially equals $(V_H+V_L)/2$.

3. The apparatus of claim 1, wherein the
    lower-threshold resistor has a resistance substantially equal to R.

4. The apparatus of claim 1, wherein the higher-threshold and lower-threshold sample and hold elements are amplifiers each having an output that is isolated from an input.

5. The apparatus of claim 1, further comprising:
    a first switch coupled between the higher-threshold node and a reference voltage; and
    a second switch coupled between the lower-threshold node and ground.

6. The apparatus of claim 5, wherein the first and second switches are to be closed to initialize $V_H$ to the reference voltage and $V_L$ to ground.

7. The apparatus of claim 5, further comprising:
    a third switch coupled between the output of the higher-threshold sample and hold element and the higher-threshold node; and a fourth switch coupled between the output of the lower-threshold sample and hold element and the lower-threshold node.

8. The apparatus of claim 1, further comprising:
    a multi-bit result register to store results from the comparator.

9. The apparatus of claim 1, wherein the apparatus is further to convert multiple digital input signals into an analog output signal $V_{OUT}$.

10. A method, comprising:
    initially setting a higher-threshold signal $V_H$;
    comparing an analog input signal $V_{IN}$ to a comparison signal $V_C$;
    providing a digital result of the comparison;
    when a digital result indicates $V_{IN}$ is less than the existing $V_C$, transferring the existing $V_C$ through a sample and hold element to set $V_H$ to the existing $V_C$; and
    successively performing comparisons and transfers to generate a digital representation of $V_{IN}$.

11. The method of claim 10, further comprising:
    initially setting a lower-threshold signal $V_L$, wherein $V_C$ substantially equals $(V_H+V_L)/2$.

12. The method of claim 11, further comprising:
    when a digital result indicates $V_{IN}$ is not less than the existing $V_C$, setting $V_L$ to the existing $V_C$.

13. The method of claim 12, wherein $V_L$ is set to the existing $V_C$ by transferring the existing $V_C$ through a sample and hold element.

14. The method of claim 11, wherein $V_H$ is initially set to a reference voltage and $V_L$ is initially set to ground.

15. The method of claim 10, wherein said providing comprising:
    storing results in a multi-bit result register.

16. A system, comprising:
    a processor having an analog to digital conversion portion that includes:
        a comparator to receive an analog input signal $V_I$ along with a comparison signal $V_C$ and to generate a digital result, the comparison signal $V_C$ being received at a comparison node,
        a higher-threshold sample and hold element to receive $V_C$ and to selectively provide $V_H$ to a higher-threshold node,
        a higher-threshold resistor having a resistance R coupled between the higher-threshold node and the comparison node,
        a lower-threshold sample and hold element to receive $V_C$ and to selectively provide $V_I$ to a lower-threshold node, and
        a lower-threshold resistor coupled between the lower-threshold node and the comparison node; and
    a battery input to receive power to be provided to the processor.

17. The system of claim 16, wherein
    the comparison signal is adjusted based on successive digital results from the comparator and $V_C$ substantially equals $(V_H+V_L)/2$.

18. The system of claim 17, wherein the
    lower-threshold resistor has a resistance substantially equal to R.

* * * * *